United States Patent [19]
Honda

[11] Patent Number: 5,834,823
[45] Date of Patent: Nov. 10, 1998

[54] TRANSISTOR WITH CONSTANT VOLTAGE DIODE

[75] Inventor: Ziro Honda, Tokyo, Japan

[73] Assignee: Mitsubishi Denki Kabushiki Kaisha, Tokyo, Japan

[21] Appl. No.: 874,504

[22] Filed: Jun. 13, 1997

[30] Foreign Application Priority Data

Feb. 25, 1997 [JP] Japan .................................. 9-040478

[51] Int. Cl.⁶ .................................................. H01L 29/76
[52] U.S. Cl. ........................ 257/488; 257/492; 257/493; 257/572; 257/546; 257/551; 257/552; 257/603; 257/606
[58] Field of Search .................................. 257/488, 106, 257/288, 491–494, 572, 516, 509, 544, 546, 551, 552, 603–606, 929, 367, 648

[56] References Cited

U.S. PATENT DOCUMENTS

| | | | |
|---|---|---|---|
| 3,626,623 | 12/1971 | Sakurai et al. | 307/303 |
| 5,646,433 | 7/1997 | Jimenez | 257/546 |
| 5,691,554 | 11/1997 | Mathews | 257/546 |

*Primary Examiner*—Tom Thomas
*Assistant Examiner*—Fetsum Abraham
*Attorney, Agent, or Firm*—Leydig, Voit & Mayer

[57] ABSTRACT

A power transistor incorporating a constant-voltage diode maintains the breakdown voltage of the constant-voltage diode at a specified level and prevents local breakdown of an insulating film located between an Al field plate electrode and a base region of the transistor by spacing the Al field plate electrode located on a collector region by a distance "d" from the base region.

5 Claims, 4 Drawing Sheets

TRANSISTOR WITH CONSTANT VOLTAGE DIODE

FIELD OF THE INVENTION

The present invention relates to a transistor, more particularly relates to a transistor provided with a constant-voltage diode having an improved secondary breakdown voltage, which is suitable for use of an electronic ignition apparatus for an automobile, a motorcycle, etc.

BACKGROUND OF THE INVENTION

FIG. 2 shows a circuit construction of an electronic ignition apparatus used in an automobile or the like. In such a circuit, first, under the condition that a current is flowing between C and E, a transistor 11 is turned off thereby to induce a voltage across a primary coil 12. The voltage induced in the primary coil 12 is stepped up by a secondary coil 13 having winding turns 100 times that of the primary coil 12, so that the electronic ignition apparatus 14 generates a spark when the voltage applied to the electronic ignition apparatus 14 reaches about 40,000 V.

When the voltage across the primary coil 12 is beyond a certain level, 520 V for example, however, the transistor 11 is out of the safe operating range thereof and may be subject to insulation breakdown or other failure.

It is a common practice to prevent such trouble by employing a construction so that when the voltage VCB induced in the primary coil 12 exceeds a certain level, a constant-voltage diode 10 breaks down thereby to cause the transistor 11 to turn on again and decrease the voltage applied to the primary coil 12, so as to prevent insulation breakdown of the transistor 11 from occurring.

FIG. 3 is a partial sectional view of the circuit of FIG. 2 formed on a semiconductor substrate. In the drawing, numeral 1 denotes a collector region of the transistor 11, 2 denotes a base region of the transistor 11, 3 denotes a channel stopper region for element isolation, 4 denotes an Al field plate electrode, 5 denotes an insulating film, 6 denotes an Al base electrode of the transistor 11 and 7 denotes a collector electrode of the transistor 11 (the emitter electrode is not shown).

FIG. 3 shows the constant-voltage diode 10 being formed in the collector-base junction between the collector region 1 and the base region 2. When voltage across the primary coil 12 of FIG. 2 increases, a high reverse voltage is applied to the constant-voltage diode 10 which is formed between the collector electrode 7 and the base Al electrode 6, so that a depletion layer extends in the collector-base junction. When the depletion layer reaches the channel stopper region 3 and the electric field in the depletion layer increases beyond a critical level, the constant-voltage diode 10 breaks down (clipping) in a so called punch-through phenomenon, thereby turning on the transistor 11.

In a conventional transistor, as shown in FIG. 3, a MOS structure is formed on the collector region 1 by installing the Al field plate electrode 4 via the insulating film 5 and electrons are induced in a region below the insulating film 5 to control the expansion of the depletion layer. In the conventional transistor, there is sometimes a problem such as a local insulation breakdown which causes a decrease in the secondary breakdown strength of the transistor.

SUMMARY OF THE INVENTION

A first object of the present invention is to provide a transistor with a constant-voltage diode having improved secondary breakdown strength.

A second object of the present invention is to provide a transistor with a constant-voltage diode to maintain the breakdown voltage of the constant-voltage diode at a specified level and prevent local breakdown from taking place in an insulating film located between an Al field plate electrode and a base region.

In my research, I have found that the conventional transistor has the Al field plate electrode 4 extending onto the insulating film 5 which lies on the base region 2, for the purpose of improving the efficiency of inducing electrons. Thus, a high voltage is applied to a region 5a which is interposed between the base region 2 of the insulating film 5 and the Al field plate electrode 4, which would result in the above local insulation breakdown.

Therefore, it has been found that the breakdown (clipping) voltage of the constant-voltage diode could be maintained at a specified level, and breakdown of the insulating film provided between the Al field plate electrode and the base region could be prevented, by forming the Al field plate electrode on the collector region at a distance "d" from the base region.

According to a first aspect of the present invention, there is provided a power transistor provided with a constant-voltage diode comprising:

a semiconductor substrate having at least a collector region of a first conductive type, a base region of a second conductive type contiguous to the collector region, and a channel stopper region of the first conductive type contiguous to the collector region and spaced from the base region, the collector region and the base region forming the constant-voltage diode;

an insulating layer on the semiconductor substrate; and a field plate electrode connected to the channel stopper region and opposite the collector region on the insulating layer for inducing an electron layer in the collector region in order to control extension of a depletion layer, the field plate electrode having an end spaced from the collector region by a distance "d" toward the base region, where a breakdown voltage drift ($V_{CBO}$) of the diode formed between the collector region and the base region is substantially zero.

In a preferred embodiment, said distance "d" may be set to be within a range of 6 to 14 μm.

Further, the insulating layer on the semiconductor substrate can prevent an insulation breaking at a higher voltage than that applied between the field plate electrode and the base region. The preferred thickness is within 4 to 8 μm.

DETAILED DESCRIPTION OF PREFERRED EMBODIMENT OF THE THE INVENTION

In a transistor according to the invention the collector region and the base region form the constant-voltage diode and, when a voltage which is out of the safe operation range of the transistor is applied across the collector and the base, the constant-voltage diode breaks down to prevent the transistor from breaking down. However, particularly in the case of the conventional structure, because the field plate electrode is provided opposite the base region with an insulating layer, between the field plate and the base region a voltage equal in magnitude to that applied across the collector and the base is applied also to the insulating film, so that local insulation breakdown tends to occur.

According to the present invention, local breakdown of the insulating film can be prevented because the field plate electrode is not arranged on the base region, and the quantity of electrons induced in the collector region surface can be maintained at or higher than a specified level because the field plate electrode is formed at a distance "d" from the base region. Thus, it is possible to make a transistor incorporating a constant-voltage diode which has improved secondary breakdown strength while maintaining the breakdown voltage of the constant-voltage diode at or higher than the specified level.

The insulating film may also be of a thickness which has an insulation breakdown strength greater than the voltage applied across the field plate electrode and the base region.

Breakdown strength of the insulating film interposed between the field plate electrode and the base region can be improved to decrease the possibility of local insulation breakdown which has been experienced in such portions in the prior art, by forming the insulating film with a thickness which is increased within such a range that allows the induction of a specified quantity of electrons in the collector region, in addition to forming of the field plate electrode at a distance "d" from the base region.

Embodiment 1

Figure 1:
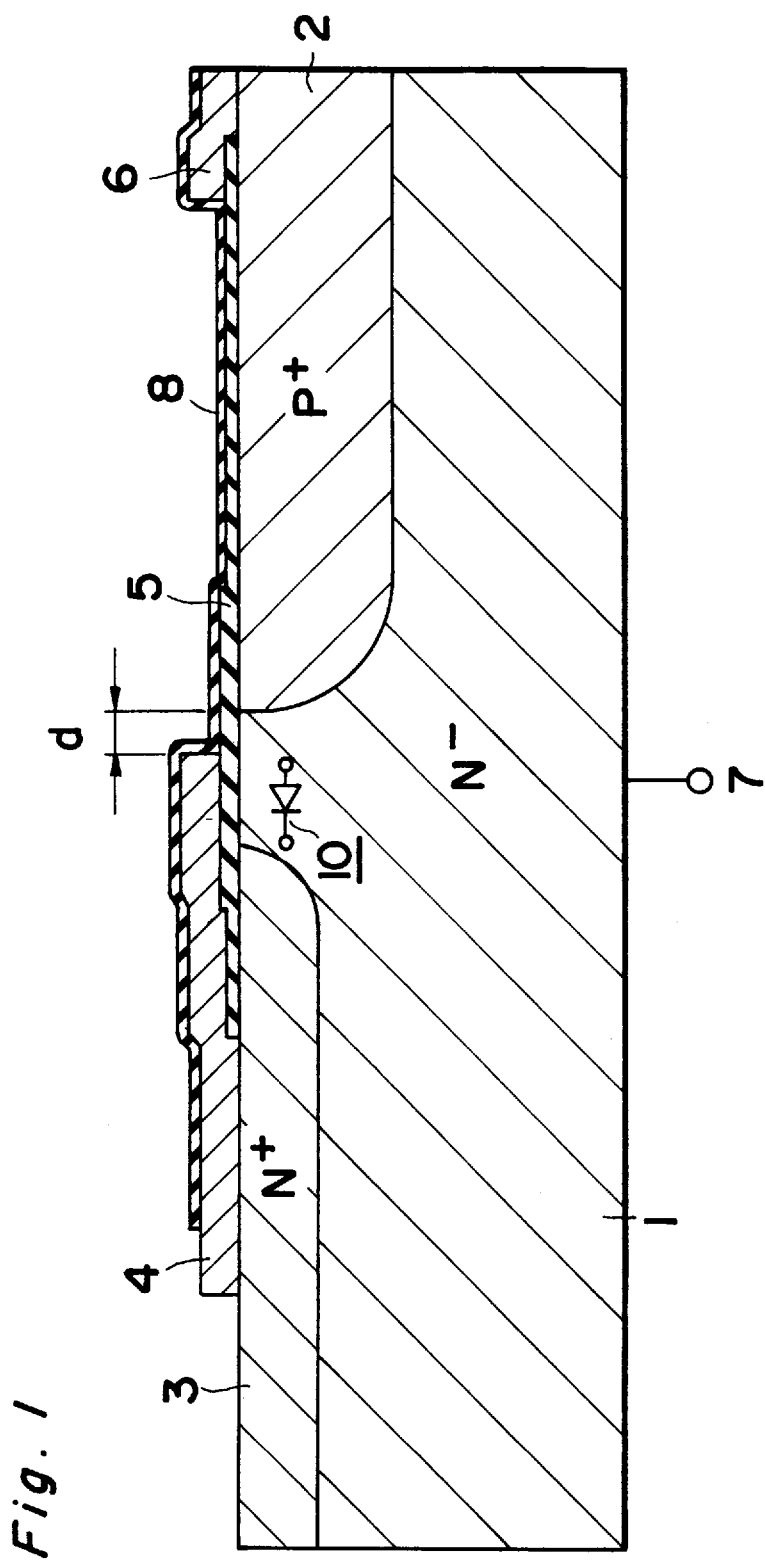
FIG. 1 is a partial sectional view of a transistor incorporating a constant-voltage diode according to the present invention.
Figure 2:
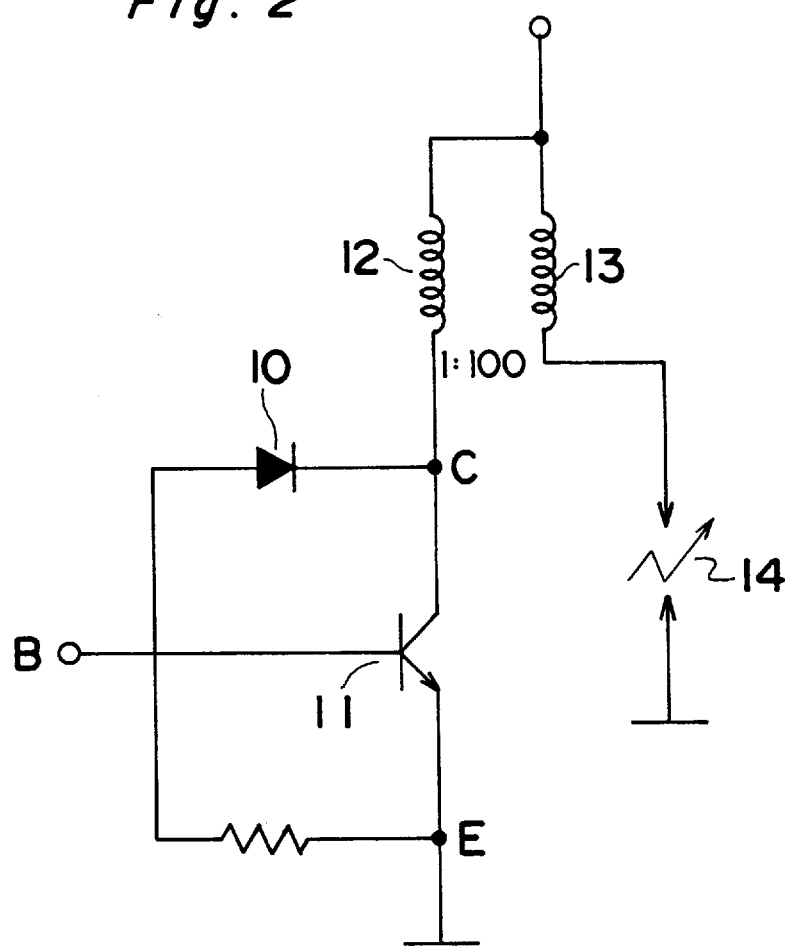
FIG. 2 is a circuit diagram of an electronic ignition apparatus including the transistor incorporating a constant-voltage diode according to the present invention.
Figure 3:
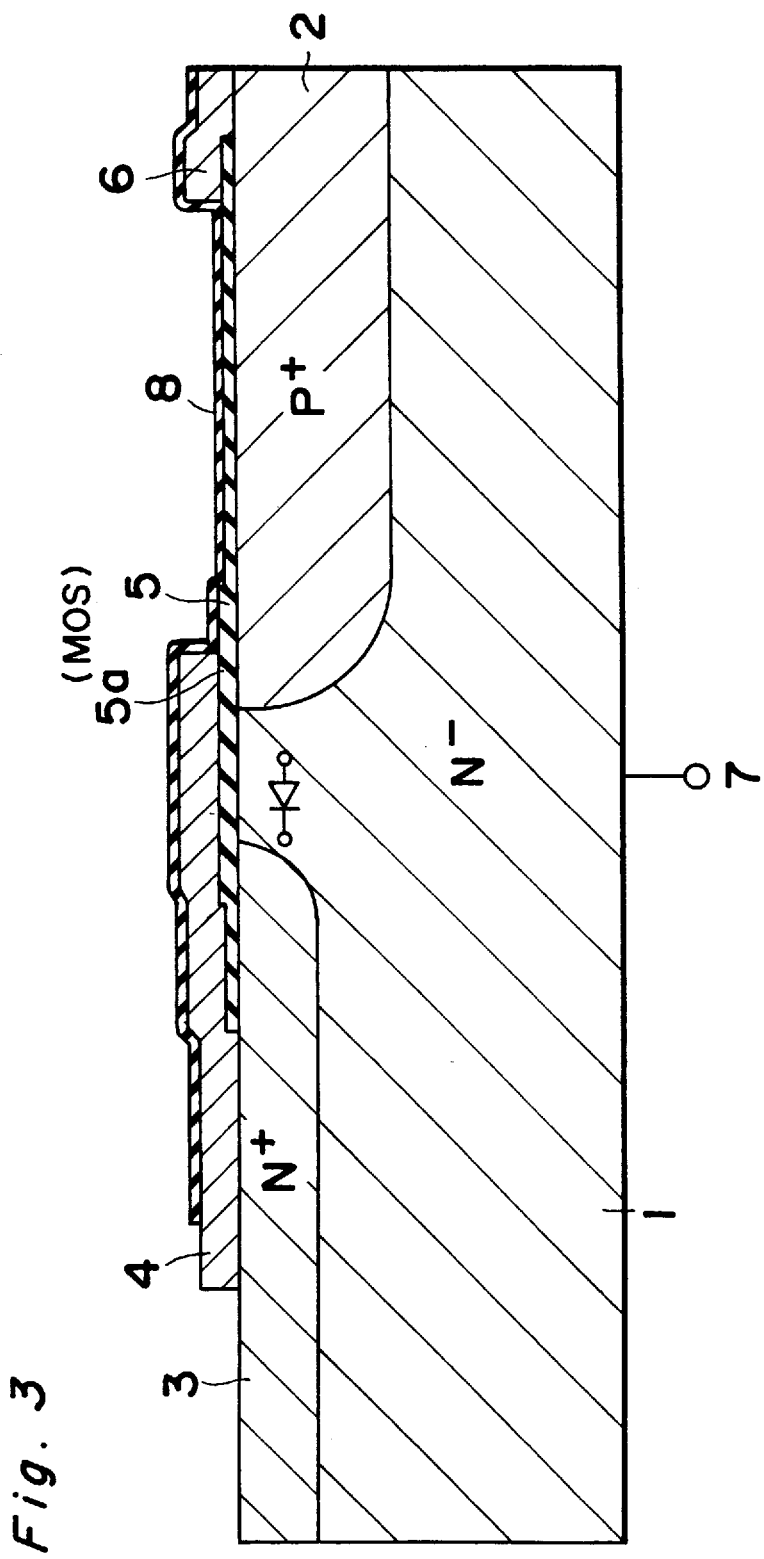
FIG. 3 is a partial sectional view of a conventional transistor incorporating a constant-voltage diode.

FIG. 1 is a partial sectional view of a semiconductor device incorporating a constant-voltage diode according to the first embodiment of the present invention. In the drawing, numerals identical with those of FIG. 3 denote the identical or corresponding parts.

In this embodiment, the Al field plate electrode 4 is shorter than that in the prior art, with one end thereof located at a position 6 μm to 14 μm from the junction of the base region 2 and the collector region 1.

The Al field plate electrode 4 covers an insulating film 5 located on the collector region 1 in order to induce electrons in the collector region 1 directly below the insulating film 5, and to suppress extension of the depletion layer of the constant-voltage diode 10 by a means similar to that of the channel stopper region 3 which is an N+ region, thereby increasing the electric field strength in the depletion layer and making breakdown easier.

That is, when the depletion layer of the constant-voltage diode 10 extends due to the reverse voltage applied thereto and reaches the electron layer induced in the N+ channel stopper region 3 and in the collector region 1 located directly below the insulating film 5, the depletion layer does not extend further so the electric field in the depletion layer increases. Thus, it is possible to control the breakdown voltage of the constant-voltage diode 10 by means of the field plate position and charge concentration of the channel stopper region 3 and the electron layer.

Therefore, simply reducing the length of the Al field plate electrode 4 causes the breakdown voltage to increase and disables the function as a protective circuit for the transistor 11.

Figure 4:
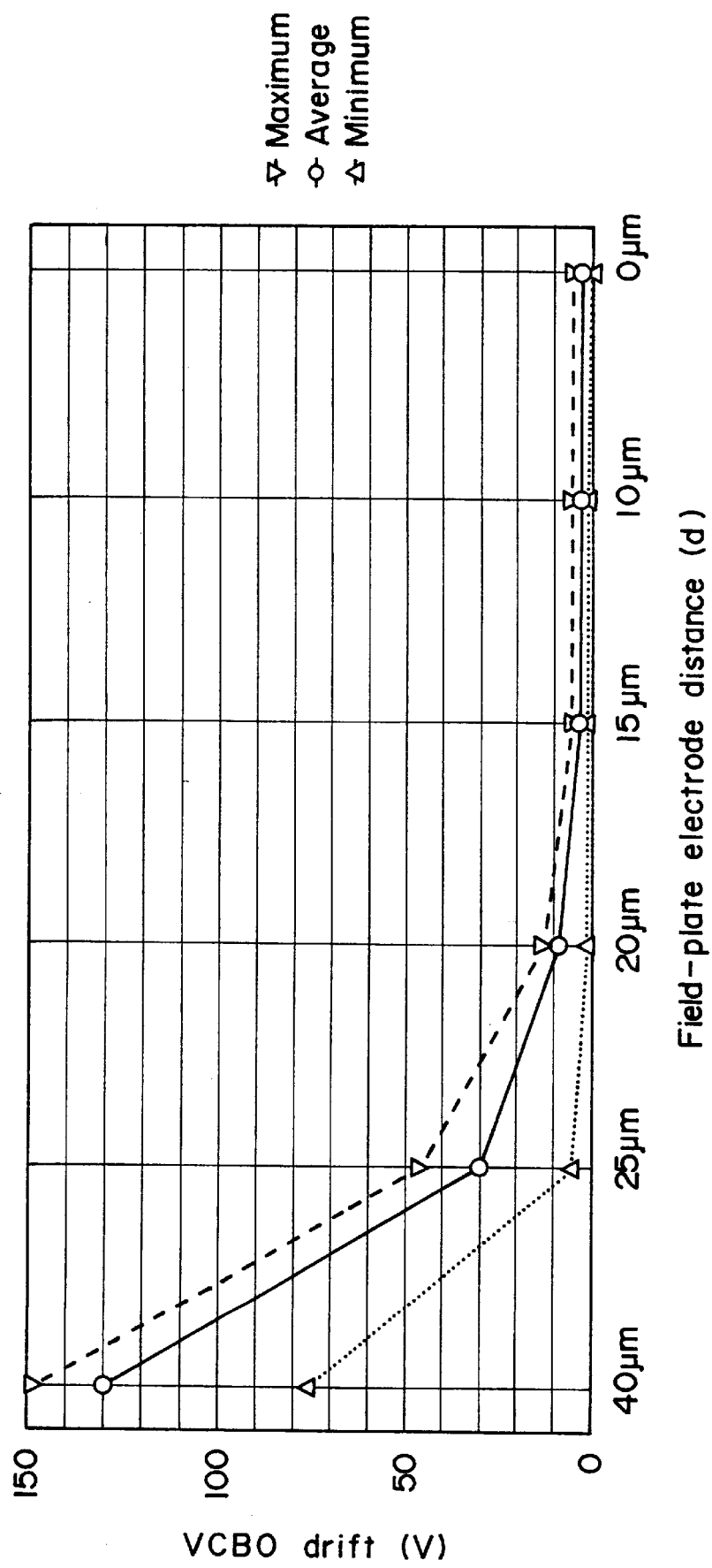
FIG. 4 is a graph showing a relation between the distance 'd' (field plate electrode specification) of the Al field plate electrode from the base region and the breakdown voltage drift ($V_{CBO}$) of the diode located between the collector region and the base region.

FIG. 4 is a graph showing a relation between the distance 'd' (field plate electrode specification) of the Al field plate electrode 4 from the base region and the breakdown voltage drift ($V_{CBO}$) of the diode formed between the collector region and the base region.

As is apparent from FIG. 4, drift of the breakdown voltage remains constant at near 0 as far as the distance 'd' is no more than 15 μm, particularly within a range from 6 to 14 μm.

Therefore, with such a structure with the Al field plate electrode located at the distance 'd', breakdown voltage can be maintained at a level similar to that of a conventional structure (d=0) and the constant-voltage diode has a sufficient breakdown voltage, thereby providing a satisfactory function as a protective circuit.

According to this embodiment, the quantity of electrons induced in the region below the Al field plate electrode 4 can be maintained at not less than a specified level and the breakdown voltage can be maintained at the specified level, by arranging the Al field plate electrode 4 at an optimum position on the collector region 1 so that the Al field plate electrode 4 and the base region 2 are separated by the specified distance "d" (e.g. 6 to 14 μm), thereby making it possible to prevent breakdown of the insulating layer 5 and improving the reliability of the transistor incorporating a constant-voltage diode.

Embodiment 2

The second embodiment of the present invention employs a method of increasing the thickness of the insulating film 5 which is interposed between the Al field plate electrode 4 and the base layer 2, in addition to the structure of the first embodiment, for preventing breakdown of the insulating film 5.

With this structure, while the probability of insulation breakdown is reduced by the increased thickness of the insulating film 5, the quantity of electrons induced in the collector region 1 below the Al field plate electrode decreases to affect the breakdown voltage of the constant-voltage diode, and therefore, the thickness of the insulating film 5 must be determined by taking these factors into consideration.

By employing such a structure, a structure which prevents the insulating film 5a from breaking down can be formed even where the distance "d" cannot be increased in the first embodiment.

In case the insulating film 5 is formed from an oxide film, it is effective when the film thickness is increased to 8.0 μm compared to 2.3 μm in the prior art.

What is claimed is:

1. A power transistor incorporating a diode comprising:
   a semiconductor substrate having
   a surface,
   at least a collector region of a first conductivity type extending to the surface,
   a base region of a second conductivity type located at the surface, contiguous to, and forming a junction with said collector region, and
   a channel stopper region of the first conductivity type located at the surface, contiguous to said collector region, and spaced from said base region, said collector region and said base region forming a diode;
   an insulating layer disposed on part of the surface of said semiconductor substrate; and
   a field plate electrode disposed partially on the surface of said semiconductor substrate directly contacting and electrically connected to said channel stopper region, disposed partially on said insulating layer opposite said collector region for inducing an electron layer in said collector region to control extension of a depletion layer from said junction, and having an end surface transverse to the surface of said semiconductor layer, located on said insulating layer opposite said collector region, and separated by a distance "d", measured parallel to the surface of said semiconductor substrate, from the junction, whereby breakdown voltage drift ($V_{CBO}$) of the diode is substantially zero.

2. The power transistor according to claim 1, wherein the distance "d" is within a range of 6 to 14 μm.

3. The power transistor according to claim 1, wherein said insulating layer on said semiconductor substrate has a thickness for preventing insulation breakdown at a higher voltage than a voltage applied between said field plate electrode and said base region.

4. The power transistor according to claim 3, wherein said thickness is within 4 to 8 μm.

5. The power transistor according to claim 1 wherein no part of said field plate electrode disposed on said insulating layer is directly opposite said base region with respect to said insulating layer.

* * * * *